US011496150B2

(12) United States Patent
Olaleye et al.

(10) Patent No.: US 11,496,150 B2
(45) Date of Patent: Nov. 8, 2022

(54) COMPRESSIVE SENSING SYSTEMS AND METHODS USING EDGE NODES OF DISTRIBUTED COMPUTING NETWORKS

(71) Applicant: SIGNIFY HOLDING B.V., Eindhoven (NL)

(72) Inventors: Olaitan Philip Olaleye, Wakefield, MA (US); Abhishek Murthy, Arlington, MA (US)

(73) Assignee: SIGNIFY HOLDING B.V., Eindhoven (NL)

(*) Notice: Subject to any disclaimer, the term of this patent is extended or adjusted under 35 U.S.C. 154(b) by 0 days.

(21) Appl. No.: 17/266,766

(22) PCT Filed: Jul. 31, 2019

(86) PCT No.: PCT/EP2019/070592
§ 371 (c)(1),
(2) Date: Feb. 8, 2021

(87) PCT Pub. No.: WO2020/030488
PCT Pub. Date: Feb. 13, 2020

(65) Prior Publication Data
US 2021/0314001 A1     Oct. 7, 2021

Related U.S. Application Data

(60) Provisional application No. 62/715,472, filed on Aug. 7, 2018.

(30) Foreign Application Priority Data

Aug. 24, 2018   (EP) .................................... 18190723

(51) Int. Cl.
*H03M 7/30*       (2006.01)
*G06F 7/58*       (2006.01)
(Continued)

(52) U.S. Cl.
CPC .......... *H03M 7/3062* (2013.01); *G06F 7/588* (2013.01); *H04L 67/10* (2013.01); *H04Q 9/00* (2013.01)

(58) Field of Classification Search
CPC ...... H03M 7/3062; G06F 7/588; H04L 67/10; H04Q 9/00
See application file for complete search history.

(56) References Cited

U.S. PATENT DOCUMENTS 4,546,342 A   10/1985  Weaver et al.
5,471,558 A   11/1995  Tsutsui
(Continued)

FOREIGN PATENT DOCUMENTS

EP       2369748 A1   9/2011
WO    2017007546 A1   1/2017
WO    2017114579 A1   7/2017

*Primary Examiner* — Wing F Chan
*Assistant Examiner* — Billy H Ng (57) ABSTRACT

A system and method for compressive sensing using edge nodes of a distributed computing network. The method includes collecting a raw data signal continuously by a sensor of the edge node. A signal energy indicator is dynamically updated that quantifies an energy distortion in the raw data signal. One or more compression characteristics are determined as a function of the signal energy indicator as the signal energy indicator is updated. The raw data signal is subsampled in accordance with current values of the one or more compression characteristics to create a compressed data signal. An output is transmitted that includes the compressed data signal to a centralized node.

14 Claims, 3 Drawing Sheets

(51) Int. Cl.
*H04L 67/10* (2022.01)
*H04Q 9/00* (2006.01)

(56) References Cited

U.S. PATENT DOCUMENTS

| | | | |
|---|---|---|---|
| 2016/0022141 A1* | 1/2016 | Mittal | G06F 7/582 |
| | | | 340/870.07 |
| 2017/0284839 A1 | 10/2017 | Ojala | |
| 2018/0183460 A1* | 6/2018 | Lee | H03M 13/6312 |
| 2018/0213348 A1* | 7/2018 | Natarajan | H04L 67/327 |
| 2021/0226647 A1* | 7/2021 | Richart | H03M 7/3059 |

* cited by examiner

COMPRESSIVE SENSING SYSTEMS AND METHODS USING EDGE NODES OF DISTRIBUTED COMPUTING NETWORKS

CROSS-REFERENCE TO PRIOR APPLICATIONS

This application is the U.S. National Phase application under 35 U.S.C. § 371 of International Application No. PCT/EP2019/070592, filed on Jul. 31, 2019, which claims the benefit of U.S. Provisional Patent Application No. 62/715,472, filed on Aug. 7, 2018 and European Patent Application No. 18190723.9, filed on Aug. 24, 2018. These applications are hereby incorporated by reference herein.

FIELD OF THE INVENTION

The present disclosure is directed generally to distributed computing systems, and more particularly to enabling compressive sensing at the sensor-enabled edge nodes of distributed computing systems.

BACKGROUND

There is an on-going trend in many industries to communicably connect together an increasingly large number of different devices that were traditionally non-connected. Examples include home and building control systems, such as connected lighting systems, inventory tracking systems, the "internet of things", and/or other "smart" or "connected" systems. Typically, the edge nodes of these systems (e.g., the luminaires in a connected lighting system) include sensors and communication modules that enable the system as a whole to more effectively, efficiently, and/or automatically react to dynamic changes in the relevant environment (e.g., home, office, warehouse, etc.). In order to make these systems feasible (e.g., economical), one typical characteristic of these systems is the limited availability of computation resources at the edge nodes (e.g., at the luminaires in a connected lighting system) and the low power bandwidth with which the nodes of the system are interconnected.

One method to address the constraints imposed by the limited resources of a connected system includes compressive sensing in which the raw collected sensor data is compressed at the edge, and then transferred to centralized or designated network infrastructure, such as a local server or the cloud, for decompression and analysis. However, as data is increasingly compressed (e.g., in order to be timely compressed and transferred over the limited bandwidth and computational resources at the edge nodes), there is a corresponding degradation in the accuracy of the data after decompression.

Accordingly, there is a continued need in the art for systems and methods to facilitate more timely, accurate, and efficient analysis of sensor data collected at resource-constrained edges nodes of distributed computing systems.

SUMMARY OF THE INVENTION

The present disclosure is directed to inventive systems and methods for providing compressive sensing using sensor-enabled edge nodes of distributed computing networks. Various embodiments and implementations herein are directed to data compression and reconstruction methods in which data is first collected by the sensor(s) of one or more edge nodes of a distributed computing network. A signal energy indicator is computed, which represents or corresponds to energy distortion in the data signal, such as variance, entropy, norm, etc. Compression parameters such as sampling frequency, window length, etc. can be determined as a function of (e.g., proportional to) the signal energy indictors.

Based on the assessed signal energy indicator, a preferred window length and/or sampling frequency of the compression is determined and parameterized by increasing the length of the window and decreasing the sampling frequency for signals of lower energy. The signal energy indictor can be automatically updated to variably adjust to changing conditions. Additionally, the compressed data signal can be decompressed based on a compression scheme selected using the energy content in the original data signal. In this way, the system can autonomously alter the characteristics of compression and decompression to variably react to changing needs while maintaining accuracy and minimizing the required transmission bandwidth and computing resources.

All examples and features mentioned below can be combined in any technically possible way.

Generally, in one aspect, a method for compressive sensing using an edge node of a distributed computing network is provided. The method includes: collecting a raw data signal continuously by a sensor of the edge node; dynamically updating a signal energy indicator ($\varepsilon$) that quantifies an energy content in the raw data signal; determining one or more compression characteristics as a function of the signal energy indicator as the signal energy indicator is updated; subsampling the raw data signal in accordance with current values of the one or more compression characteristics to create a compressed data signal; and transmitting an output that includes the compressed data signal to a centralized node.

According to an embodiment, the one or more compression characteristics includes a sampling frequency ($\delta$), a signal window length (N), or a combination including at least one of the foregoing.

According to an embodiment, the signal window length is also determined based on a network capacity ($\emptyset$) of the distributed computing network available to the edge node.

According to an embodiment, the subsampling includes at least one of randomly subsampling and randomly down-sampling the raw data signal with respect to the sampling frequency.

According to an embodiment, the method further includes generating random numbers with a random number generator and utilizing the random numbers as indices for the at least one of subsampling and down-sampling.

According to an embodiment, the random number generator is a seedable random number generator, such that the random numbers can be recreated by seeding a second instance of the random number generator at the centralized node during decompression of the compressed data signal.

According to an embodiment, the edge node is provided with a fixed network capacity ($\emptyset$), the method further comprising comparing a size of the compressed data signal to the fixed network capacity and subsampling the compressed data signal to further compress the compressed data signal if the size is greater than that permitted by the fixed network capacity.

According to an embodiment, the method further includes sending additional samples or packets from the raw data signal if the size of the compressed data signal is less than that permitted by the fixed network capacity.

According to an embodiment, the method further includes decompressing the compressed data signal with the centralized node.

According to an embodiment, the method further includes an estimate of energy in the raw data signal based on a size of the compressed data signal with respect to the raw data signal.

According to an embodiment, the method further selecting a decompression algorithm based on the estimate of energy in the raw data signal.

Generally, in another aspect, an edge node for a distributed computing network is provided. The edge node includes: a communication module configured to enable data communication over the distributed computing network; a sensor configured to continuously collect a raw data signal related to one or more parameters of an environment local to the edge node; and a controller. The controller is configured to: receive the raw data signal; dynamically update a signal energy indicator that quantifies an energy distortion in the raw data signal; determine one or more compression characteristics as a function of the signal energy indicator as the signal energy indicator is updated; subsample the raw data signal in accordance with current values of the one or more compression characteristics to create a compressed data signal; and transmit an output that includes the compressed data signal to a centralized node on the distributed computing network.

According to an embodiment, the edge node comprises a luminaire.

According to an embodiment, the sensor is a motion detection sensor.

According to an embodiment, a system includes the edge node and a centralized node, wherein the centralized node is a gateway, a server, a cloud computing implementation, or a combination including at least one of the foregoing.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

DETAILED DESCRIPTION OF EMBODIMENTS

The present disclosure describes various embodiments of providing compressive sensing using edge nodes of a distributed computing network. More generally, Applicant has recognized and appreciated that it would be beneficial to provide a sensor-enabled edge node that is configured to adaptively adjust compression characteristics based on a signal energy indicator that is determined as an estimate or quantification of energy distortion in the raw data signal collected by the sensors of the edge node. A particular goal of utilization of certain embodiments of the present disclosure is to improve the reconstruction accuracy of compressed data, particularly with respect to data compressed by resource-limited edge nodes.

In view of the foregoing, various embodiments and implementations are directed to data compression and reconstruction methods in which data is first collected by the sensor(s) of one or more edge nodes of a distributed computing network. A signal energy indicator is computed, which represents or corresponds to energy distortion in the data signal, such as variance, entropy, norm, etc. Compression parameters such as sampling frequency, window length, etc. can be determined as a function of (e.g., proportional to) the signal energy indictors.

Based on the assessed signal energy indicator, a preferred window length and/or sampling frequency of the compression is determined and parameterized by increasing the length of the window and decreasing the sampling frequency for signals of lower energy. The signal energy indictor can be automatically updated to variably adjust to changing conditions thereby causing a corresponding adjustment to the window length and sampling frequency of the compression scheme. Additionally, the compressed data signal can be decompressed based on a compression scheme selected based on the energy content in the original data signal. In this way, the system can autonomously alter the characteristics of compression and decompression to variably react to changing needs while maintaining accuracy and minimizing the required transmission bandwidth and computing resources.

Figure 1:
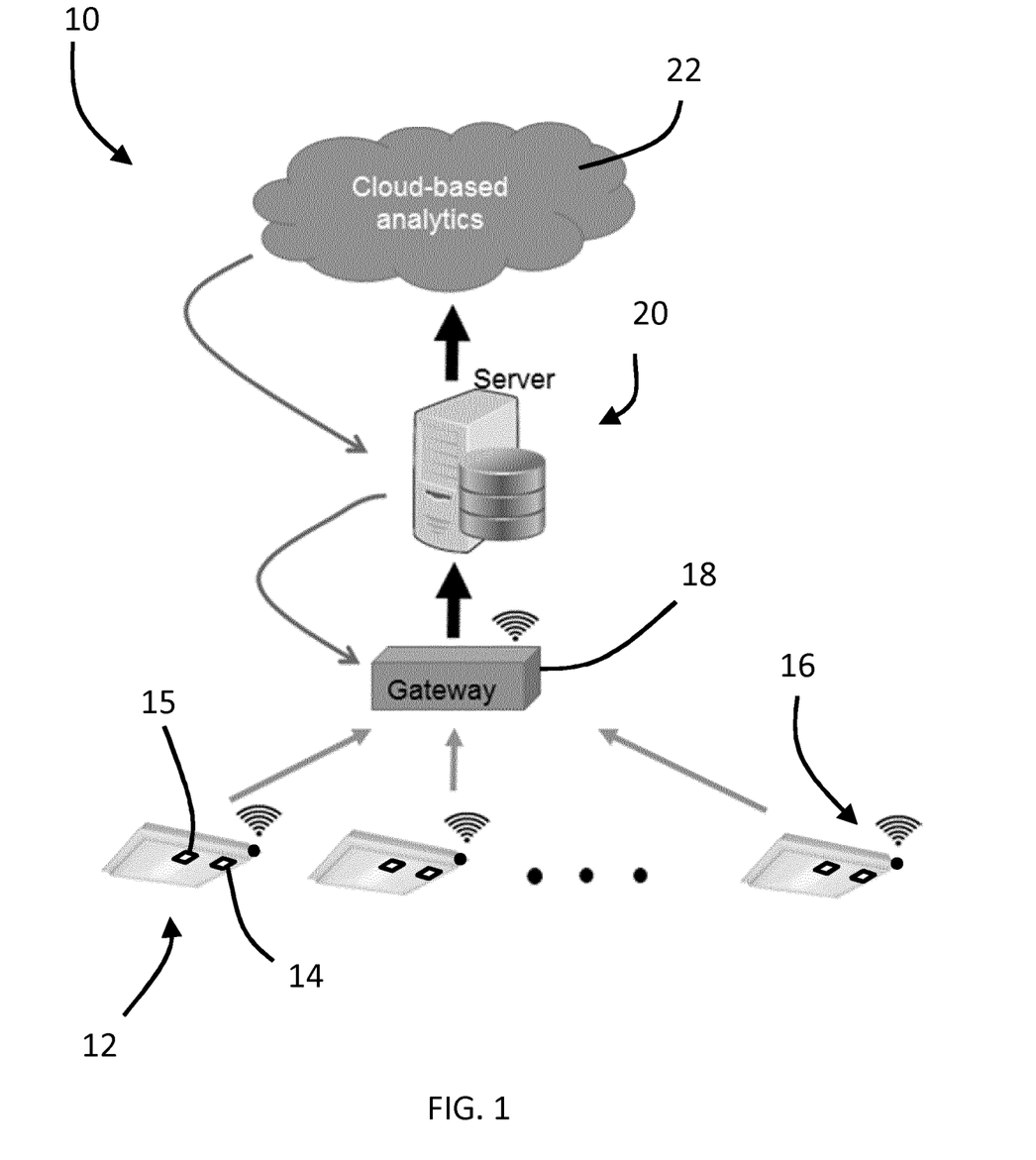
FIG. 1 schematically illustrates a distributed computing system having a plurality of edge nodes according to one embodiment disclosed herein.

Referring to FIG. 1, in one embodiment, a distributed computing network or system 10 having a plurality of edge nodes 12 is provided. In particular, FIG. 1 illustrates the computing system 10 as a connected lighting system, with the edge nodes 12 provided as luminaires. However, it is to be appreciated that any other connected or "smart" computing system may be utilized, e.g., building control systems such as for automating heating, cooling, ventilation, security, noise suppression, etc., or other computing systems such as inventory tracking systems, Internet of Things systems, etc. At a minimum, each of the edge nodes 12 includes a sensor 14 (or multiple sensors) configured to collect data related to one or more parameters pertaining to the surrounding environment and/or diagnostic data pertaining to the sensor 14, a controller 15 configured to control operation of the respective edge node 12, and a communication interface or module 16 that enables data communication between the edge nodes 12 and/or with other nodes or devices.

The term "centralized node" as used herein is intended to broadly refer to any designated network or processing equipment. Examples include a gateway 18, a server 20 (e.g., local network server), and a cloud computing implementation 22 (alternatively, the "cloud 22"). Thus, the centralized nodes generally provide additional computing resources for higher level processing needs, control operation of the system 10, enable certain features of the system 10, facilitate network traffic, etc. It is to be appreciated that the system 10 may include one or both of the server 20 and the cloud 22, which separately and/or together provide centralized computing resources for the system 10. For example, the central server 20 and/or the cloud 22 can be included to decompress and/or analyze the data collected by the sensors 14 and compressed at the edge nodes 12 as discussed in more detail herein.

It is to be appreciated that each of the edge nodes 12, the gateway 18, the server 20, and/or the cloud 22 may include suitable hardware and software to embody and enable the structure, features, and functionality disclosed herein. For example, each of the gateway 18, the server 20, and the cloud 22 may include sensors, controllers, and communication modules akin to (e.g., but having more computational resources than) those described with respect to the edge nodes 12. Any such controllers may be, or include, a processor, memory, algorithm, or other hardware or software component.

Processors (e.g., for the controllers 15) may take any suitable form, such as a microcontroller, plural microcontrollers, circuitry, a single processor, or plural processors configured to execute software instructions. Similarly, memory (e.g., for the controllers 15) may take any suitable form or forms, including a volatile memory, such as random access memory (RAM), or non-volatile memory such as read only memory (ROM), flash memory, a hard disk drive (HDD), a solid state drive (SSD), or other data storage media. Memory may be used by a processor for the temporary storage of data during its operation. Data and software, such as the algorithms or software necessary to perform the methods and provide the features and functionality discussed herein, as well as an operating system, firmware, or other application, may be installed in memory. Communication modules as referred to herein (e.g., the communication modules 16) are arranged to enable communication between the components of the system 10. The communication module may be or include any module, device, or means capable of enabling the transmission and/or reception of a wired or wireless communication signal, e.g., a transmitter, receiver, transceiver, antenna, etc., utilizing technologies that include, but are not limited to Wi-Fi (e.g., IEEE 802.11), Bluetooth, cellular, Ethernet, Zigbee, etc. As discussed herein, of particular note are the more relatively low-power or resource constrained technologies, such as Zigbee.

The sensors 14 can be configured to collect any desired or selected data parameter related to the local environment, such as motion detection (e.g., radiated infrared energy), temperature, humidity, ambient noise level, ambient light level, etc. Additionally, the sensors 14 can also be configured to collect diagnostic data pertaining to the health and/or performance of the sensor 14. The system 10 may be arranged to utilize this data to automate or make more efficient certain features or functionality of its components, such as the edge nodes 12. For example, referring back to an embodiment in which the system 10 is a connected lighting system, the sensors 14 may be motion detection sensors that enable the system 10 to automatically turn lights on upon detection of movement and/or to turn off lights after a preset period of time elapses in which movement is not detected. Those of ordinary skill in the art will recognize other types of distributed computing systems and collected data that can be utilized to facilitate operation of these other systems.

It is also to be appreciated that the system 10 may be equipped with algorithms related to artificial intelligence, machine learning, artificial neural networks, etc. in order to enable advance decision making analytics and determination, such as context awareness, activity, event, or scene recognition, etc., based on the collected data. In one example, one or more algorithms may be utilized (e.g., by the server 20 and/or the cloud 22) to process the data collected by the sensors 14 to attempt to make a higher level determination or probabilistic guess as to a corresponding activity or scenario based on that data. For example, collected motion detection data may be analyzed to estimate a number of occupants in one or more designated areas. While motion detection data only indicates detected motion, the data can be analyzed for patterns that the algorithm learns, or is trained to, recognize or correlate to a corresponding event (or a likelihood of the corresponding event occurring), such as occupant count. For example, higher levels of detected motion in a concentrated area may be interpreted as or correlated to a larger estimated occupant count. It is to be appreciated that this is merely one example and many other possibilities of higher level determinations made from collected sensor data will be appreciable to those of ordinary skill in the art.

In accordance with embodiments disclosed herein, and as discussed in more detail below, the edge nodes 12 (e.g., via the controllers 15) are configured to compress the raw data collected by the sensors 14 by taking samples adaptively and/or across varying time-windows, based on the assessed signal energy of the data signal for the corresponding time window. Advantageously, sampling adaptively and across varying time-windows leads to significant improvements in the recovery accuracy of the decompression algorithm, which in particular enables compressive sensing to be feasible for deployment on low power or limited bandwidth communication networks (e.g., Zigbee).

Figure 2:
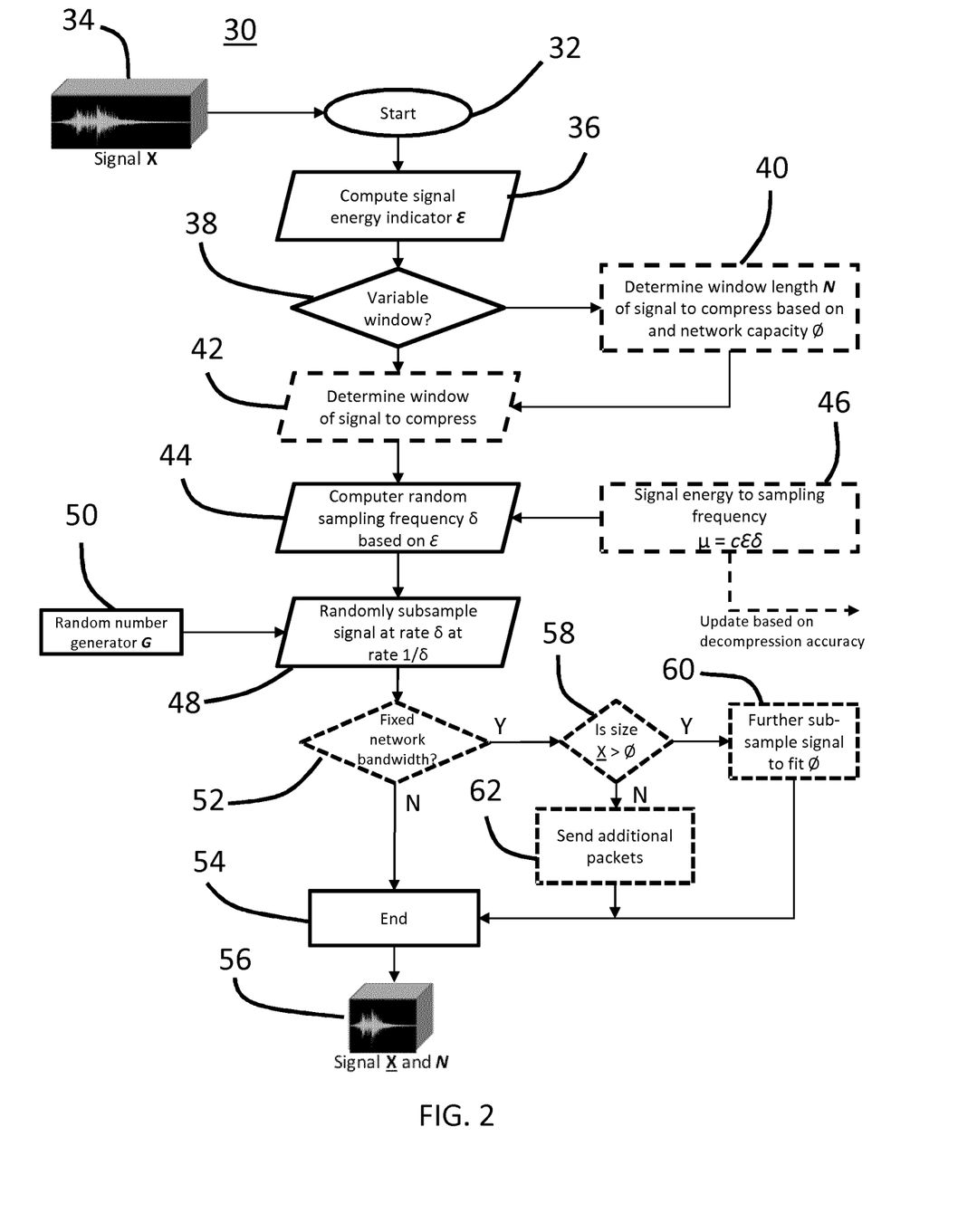
FIG. 2 is a flow chart illustrating a method of compressing data with an edge node according to one embodiment disclosed herein.

A method 30 according to one embodiment for compressing raw collected data is shown in FIG. 2. For example, the method may be implemented by the edge nodes 12 to create a smaller sized data package that can be more efficiently transmitted over limited bandwidth to a centralized processing node such as the server 20 and/or the cloud 22. It is noted that while generally all steps in the disclosed methods (including the method 30) can be supplemented, replaced, removed, altered, or reordered from the illustrated arrangement, those considered to be more highly optional are outlined by dotted lines in the FIGS.

The method 30 starts at step 32 in which an input signal 34 is received in the form of a raw data signal, also indicated as a signal X. That is, the signal X (and/or the input 34) may be generated from the data collected by the relevant sensors (e.g., one or more of the sensors 14) and sent to a controller (e.g., the controller 15) of the edge node. At step 36, a signal energy indicator ($\varepsilon$) is determined (e.g., by the controller 15 of the corresponding edge node 12). The signal energy indicator E refers to one or more selected values or parameters that indicate or correspond to energy distortion in the data signal. Examples of parameters that can be used as, or for determining, the signal energy indicator $\varepsilon$ include variance, entropy, norm, etc., although it is to be appreciated that any other statistical or mathematical parameter that directly or indirectly identifies, quantifies, or represents the energy of the signal may be utilized, e.g., by detecting changes, variability, or fluctuations in the raw data signal. Those of ordinary skill in the art will appreciate that the parameters such as variance, entropy, norm, etc., can be calculated according to any mathematical and/or statistical methodology known or discovered in the art. As discussed in more detail below, one or more compression characteristics, such as sampling frequency, sampling window length, etc. may be determined based on the signal energy indicator.

At step 38 it is determined whether variable window compression is desired. For example, this refers to the entire period of time (the window) over which data is to be collected for creating the final transmitted compressed data package. If it is desired to variably set the size of the window, then the method proceeds to step 40 in which the window length (N) is determined based on the signal energy indicator ε, the network capacity (Ø), etc. For example, if the network capacity Ø indicates limited bandwidth or other resources in the network, then the window length N may be shorter than for higher bandwidth networks. Similarly, if the signal energy indicator ε indicates a high degree of information content of which variance is an indicator (e.g., signal is changing frequently), then the system may set the window length N shorter to ensure the changes in the collected data sufficiently captured after the data is compressed. The preferred window is then set at step 42. If a variable window size is not desired, then step 38 may proceed directly to step 42, e.g., utilizing a default value for the window length N and/or a previously selected/determined value for the window length N (e.g., from a previous iteration or cycle of the method 30).

At step 44, a sampling frequency (δ) is determined based on the signal energy indicator ε. For example, the system may determine the sampling frequency δ in proportion to the signal energy indicator ε, with values of the signal energy indicator ε indicating higher variability in the collected data signal X resulting in a faster sampling frequency δ. In other words, faster sampling speeds are selected so that volatility in the collected data signal X is not lost after compression. Similarly, the sampling frequency can be slowed down if the raw data signal isn't changing much. The sampling frequency δ may vary widely depending on the requirements of the system. For example, the sampling frequency δ may be once every few seconds, minutes, hours, etc., multiple times each second, minute, hour, etc., hundreds of times a second, or more.

The relationship between signal energy indicator ε and the sampling frequency δ may be determined via a preset function or algorithm. To this end, the method 30 includes a step 46 in one embodiment in which the sampling frequency δ is determined via an estimation e.g. using such an equation as $\mu = c\epsilon\delta$, where c is weighting coefficient which can be learned or fixed and u is an indicator of the data signal size. The variables of the function may be set and updated over time based on the resulting accuracy of the decompression of the data compressed in accordance with the equation. Those of ordinary skill in the art will recognize that this is one example and that based on the disclosure herein other equations can be utilized to determine the sampling frequency δ from the signal energy indicator ε. For example, each of the edge nodes 12 may have a table stored in memory, which enables the edge node 12, e.g., via the controller 15, to look up values for the sampling frequency δ, the window length N, etc., corresponding to the computed value of the signal energy indicator ε.

At step 48, the collected data signal X is subsampled based on the sampling frequency δ. For example, a random number generator 50 may be included to create random numbers G, from which the subsampling is randomly performed. For example, the random numbers can be used as the indices for the subsampling. The random number generator 50 can be arranged according to any desired implementation, e.g., a software algorithm. Additionally, it is to be appreciated that "random" is not intended to mean truly random, and can include pseudo-random or other values. As will be appreciated in view of the below-discussion regarding decompression, the random number generator 50 may be a seedable random number generator, such that the same values for G can be later created during decompression by another node running the same algorithm as the random number generator 50, thereby avoiding the need to separate transmit a dictionary of the indices. Subsampling the signal X in step 48 results in a compressed signal X.

At step 52, it may be determined whether a fixed network bandwidth is to be used. If not, then the method 30 can terminate at step 54, which results in an output 56, e.g., the compressed signal X and the window length N, as applicable, which are output regardless of size. Alternatively, if a fixed network bandwidth is to be imposed, then step 52 may proceed to step 58 at which it is determined whether the size of the compressed signal X is greater than that permitted by the network capacity Ø. If the compressed signal X is still too large, the compressed signal X can be further subsampled at step 60, e.g., akin to the step 48, and provided to the output 56. If step 58 determines that the compressed signal X is less than the network capacity Ø, then at step 62 either the compressed signal X is provided to the output 56 or the compressed signal X is augmented with additional data samples or packets. For example, additional samples may be taken from the raw data signal within the window as determined at step 42, or additional packets can be generated on data gathered outside of the window. The compressed signal X, with or without any additional packets, may then be provided to the output 56.

As discussed herein, the method 30 may repeat and iterate multiple successive times, e.g., the method 30 may be implemented continuously. For example, the signal energy indicator ε can be updated on a periodic basis and continuously updated over time in response to the collected data signal X. The collected data signal X may likewise be collected continuously, which may include a constant stream of data, discrete successive pulses (with or without pauses between each), etc. In any case, distributed systems such as the system 10 that operate in accordance with the method 30 can dynamically react (e.g., in real-time) to changing conditions as indicated by the data signal X collected by the sensors 14. For example, as the signal energy indicator ε indicates more energy in the data signal X collected by the sensors 14, the system 10 can automatically and dynamically change the sampling parameters (e.g., sampling frequency δ, window length N, etc.) to enable more accurate reconstruction of the resulting compressed signal X. Similarly, as the signal energy indicator ε indicates less energy in the data signal X collected by the sensors 14, the system 10 can automatically and dynamically change the sampling parameters to reduce the computational resources and bandwidth requirements, thereby increasing operational efficiency in the system 10.

Figure 3:
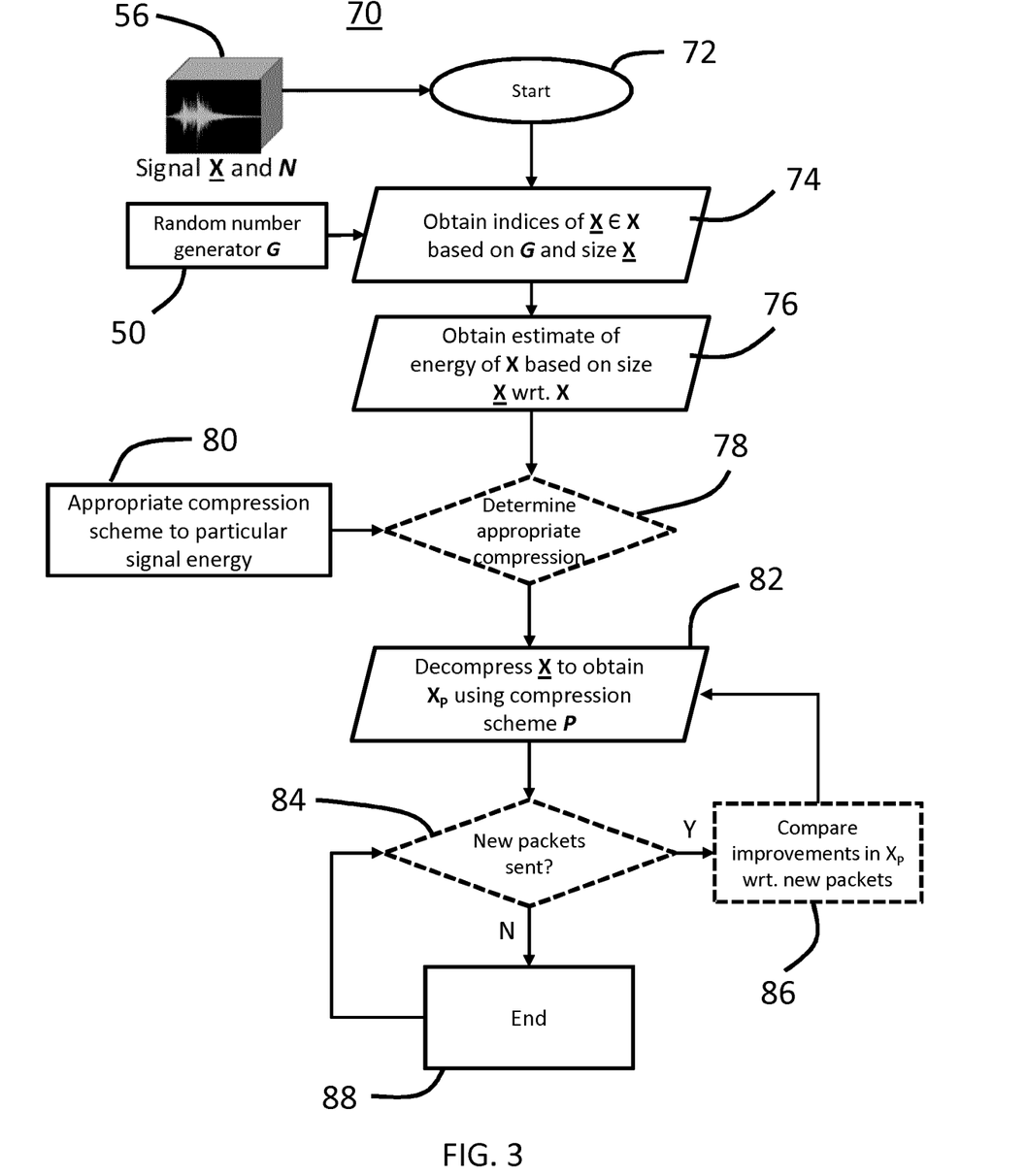
FIG. 3 is a flow chart illustrating a method of decompressing a compressed data signal according to one embodiment disclosed herein.

A method 70 for decompressing the compressed data signal X is shown in FIG. 3, which may be implemented by a centralized node, such as the gateway 18, the server 20, and/or the cloud 22. The method starts at step 72 at which at least a compressed data signal X is received, e.g., the output 56 from the method 30. At step 74, the indices of the compressed data signal are retrieved based on the random numbers (G) generated by the random number generator 50. That is, as discussed above, the random number generator 50 may be a seedable random number generator, with instances of the same algorithm installed on both the edge nodes 12 and the centralized node that performs the decompression.

At step 76, the energy of the original raw data signal X is estimated based on the size of the compressed data signal X with respect to the raw data signal X. In one embodiment, the output 56 may include the energy signal indictor E, which is provided to the centralized node in lieu of or in addition to the step 76. At step 78, it can be determined whether it is desired to select a preferred compression scheme based on the estimated energy from step 76. If so, then at a step 80, a decompression scheme (P) may be provided. For example, the decompression scheme P for solving the reconstruction problem may include solving the primal dual optimization, basis pursuit, the L1-Norm optimization problem, the linear approximation problem, any dictionary learning completion scheme, total variation compression scheme, Principal Components Analysis (PCA), smoothing, etc. For example, each decompression scheme P may correspond to different values of estimated energy and/or other known parameters of the type of data compressed (sensor modality), signal window length, etc. Alternatively in lieu of the steps 78 and 80, decompression can be implemented via a default or preset decompression scheme.

At step 82, the compressed data signal X is recovered using a decompression algorithm corresponding to the selected decompression scheme P, resulting in a recovered data signal $X_P$. A suitable basis representation to accompany decompression scheme P can also be identified. For example, signals of higher energy content can be decompressed with a different kind of basis function compared to lower energy or large signal windows. At step 84, it is determined whether any new or additional packets have been sent by the edge node 12 (e.g., via the step 62). If yes, at step 86 any improvements in $X_P$ with respect to the additional packets can be determined as the method is returned to step 82 for decompression of the additional packets. If new packets are not received or available, then the method 70 may terminate at step 88 with the recovered data signal $X_P$ as an output.

While several inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. As used herein in the specification and in the claims, "or" should be understood to have the same meaning as "and/or" as defined above.

It should also be understood that, unless clearly indicated to the contrary, in any methods claimed herein that include more than one step or act, the order of the steps or acts of the method is not necessarily limited to the order in which the steps or acts of the method are recited.

The invention claimed is:

1. A method for compressive sensing using an edge node of a resource-constrained distributed computing network, wherein the edge node is provided with a fixed network capacity (Ø) and is configured to execute the method comprising:
   collecting a raw data signal (X) continuously by a sensor of the edge node of the resource-constrained distributed computing network;
   dynamically updating a signal energy indicator ($\varepsilon$) that quantifies a variance in the raw data signal;
   determining one or more compression characteristics as a function of the signal energy indicator as the signal energy indicator is updated;
   subsampling the raw data signal in accordance with current values of the one or more compression characteristics to create a compressed data signal;
   comparing a size of the compressed data signal to the fixed network capacity (Ø) and further subsampling the compressed data signal to further compress the compressed data signal if the size of the compressed data signal is greater than a size permitted by the fixed network capacity; and
   transmitting an output that includes the compressed data signal to a centralized node of the resource-constrained distributed computing network.

2. The method of claim 1, wherein the one or more compression characteristics includes a sampling frequency ($\delta$), a signal window length (N), or a combination including at least one of the foregoing.

3. The method of claim 2, wherein the signal window length is also determined based on the fixed network capacity (Ø) of the distributed computing network available to the edge node.

4. The method of claim 2, wherein the subsampling includes at least one of randomly subsampling and randomly down-sampling the raw data signal with respect to the sampling frequency.

5. The method of claim 4, further comprising generating random numbers with a random number generator and utilizing the random numbers as indices for the at least one of subsampling and down-sampling.

6. The method of claim 5, wherein the random number generator is a seedable random number generator, such that the random numbers can be recreated by seeding a second instance of the random number generator at a centralized node during decompression of the compressed data signal.

7. The method of claim 6, further comprising sending additional samples or packets from the raw data signal if the size of the compressed data signal is less than the size permitted by the fixed network capacity.

8. The method of claim 1, further comprising decompressing the compressed data signal by the centralized node.

9. The method of claim 8, further comprising estimating energy in the raw data signal based on a size of the compressed data signal with respect to the raw data signal.

10. The method of claim 9, further comprising selecting a decompression algorithm based on the energy estimated in the raw data signal.

11. An edge node for a resource-constrained distributed computing network, wherein the edge node is provided with a fixed network capacity (Ø), the edge node comprising:
a communication module configured to enable data communication over the resource-constrained distributed computing network;
a sensor configured to continuously collect a raw data signal (X) related to one or more parameters of an environment local to the edge node; and
a controller configured to:
receive the raw data signal;
dynamically update a signal energy indicator ($\varepsilon$) that quantifies a variance in the raw data signal;
determine one or more compression characteristics as a function of the signal energy indicator as the signal energy indicator is updated;
subsample the raw data signal in accordance with current values of the one or more compression characteristics to create a compressed data signal;
compare a size of the compressed data signal to the fixed network capacity (Ø) and further subsample the compressed data signal to further compress the compressed data signal if the size of the compressed data signal is greater than a size permitted by the fixed network capacity; and
transmit an output that includes the compressed data signal to a centralized node on the resource-constrained distributed computing network.

12. The edge node of claim 11, wherein the edge node comprises a luminaire.

13. The edge node of claim 12, wherein the sensor is a motion detection sensor.

14. A system including the edge node of claim 11 and a centralized node, wherein the centralized node is a gateway, a server, a cloud computing implementation, or a combination including at least one of the foregoing.

* * * * *